United States Patent
Ryan et al.

(10) Patent No.: US 7,745,927 B2
(45) Date of Patent: Jun. 29, 2010

(54) HEAT SINK FORMED OF MULTIPLE METAL LAYERS ON BACKSIDE OF INTEGRATED CIRCUIT DIE

(75) Inventors: Vivian Ryan, Hampton, NJ (US); Richard Handly Shanaman, III, Richland, PA (US)

(73) Assignee: Agere Systems Inc., Allentown, PA (US)

( * ) Notice: Subject to any disclaimer, the term of this patent is extended or adjusted under 35 U.S.C. 154(b) by 16 days.

(21) Appl. No.: 10/879,909

(22) Filed: Jun. 29, 2004

(65) Prior Publication Data

US 2005/0287952 A1      Dec. 29, 2005

(51) Int. Cl.
*H01L 23/34* (2006.01)

(52) U.S. Cl. ............... 257/712; 257/718; 257/720; 257/E33.075

(58) Field of Classification Search .......... 257/704, 257/706, 678, 687, 675, 758, 668, 707, 712, 257/717–722, E33.075, E31.131, E23.051; 438/121, 123, 33, 106, 107, 68, 459, 456
See application file for complete search history.

(56) References Cited

U.S. PATENT DOCUMENTS

| | | | |
|---|---|---|---|
| 4,080,722 A | | 3/1978 | Klatskin et al. |
| 4,451,972 A | | 6/1984 | Batinovich |
| 4,722,130 A | * | 2/1988 | Kimura et al. .......... 29/413 |
| 4,866,505 A | | 9/1989 | Roberts et al. |
| 5,027,997 A | * | 7/1991 | Bendik et al. .......... 228/123.1 |
| 5,635,010 A | * | 6/1997 | Pepe et al. .......... 156/264 |
| 5,773,362 A | | 6/1998 | Tonti et al. |
| 6,350,634 B2 | | 2/2002 | Ma |

* cited by examiner

*Primary Examiner*—Hoa B Trinh
(74) *Attorney, Agent, or Firm*—Ryan, Mason & Lewis, LLP

(57) ABSTRACT

An integrated circuit die includes a substrate having a front surface and a back surface, wherein the substrate front surface has electrical circuits formed thereon, and the substrate back surface has a plurality of metal layers formed thereon. The plurality of metal layers comprises at least one layer having a thickness of greater than about ten micrometers. The outermost metal layer may be mechanically and thermally bonded to a package using a die attach layer comprising a thermally conductive reflowable material. The invention advantageously facilitates the dissipation of heat from the integrated circuit die.

7 Claims, 2 Drawing Sheets

HEAT SINK FORMED OF MULTIPLE METAL LAYERS ON BACKSIDE OF INTEGRATED CIRCUIT DIE

FIELD OF THE INVENTION

This invention relates generally to integrated circuits, and more specifically to techniques for controlling heat dissipation in integrated circuits.

BACKGROUND OF THE INVENTION

With advances in semiconductor design and fabrication, the circuit density that can be implemented on a given integrated circuit die has steadily increased. With this increased density, the power consumption and heat generation have also correspondingly grown. This increase in heat requires a design for efficiently removing heat from an integrated circuit die in order to avoid temperature induced failures.

A typical approach to removing heat from an integrated circuit die is to attach a heat sink to the exterior of the semiconductor packaging. A heat sink is commonly understood to increase the dissipation of heat by means of conduction, convection and radiation as a result of the heat sink's high thermal conductivity and relatively large mass and surface area. The package itself is relied upon to provide the thermal pathway from the integrated circuit die to the external heat sink. In a typical embodiment, a die attach material adheres the backside of the integrated circuit die to the package baseplate which may be a leadframe or a plastic or ceramic substrate. The type of material used for the die attach is a function of the package type and performance requirements. Typical materials are epoxy, lead-tin solder and gold alloys.

Unfortunately, such a configuration may result in device reliability failures and other problems. Heat dissipation with this configuration may simply be inadequate for higher power devices. In addition, voids and poor coverage by the die attach layer may cause temperature gradients across the integrated circuit die. These gradients may cause regions of the die to be outside of the optimal operating temperature range, and may also cause mechanical stresses due to non-uniform thermal expansion.

The prior art contains a number of methods for improving the heat dissipation from a packaged integrated circuit die. One such method involves using a flip chip package instead of a wire-bonded package. A flip chip package design has better thermal performance when compared with a wire-bonded device because of the large cross-section and good conductivity provided by the "solder ball" contacts. Other methods involve optimizing external heat sink composition and shape and/or adding a fan to aid in convective cooling. Finally, an epoxy-based die attach may be optimized for thermal conduction by filling the material with metal particles.

Many of these methods are unable to provide adequate cooling capacity for higher power devices. In addition, many of these techniques are not cost effective. For the foregoing reasons, a new design that enhances cooling capacity while staying within the constraints of modern integrated circuit fabrication technology is desirable.

SUMMARY OF THE INVENTION

The present invention addresses the above-identified need by providing techniques for increasing heat dissipation in an integrated circuit. Importantly, the present invention in an illustrative embodiment can be implemented utilizing processing steps commonly available in integrated circuit manufacturing and packaging, and can be implemented without significant modifications to the device design. Accordingly, any additional costs associated with implementing the processing steps associated with this illustrative embodiment may be quickly recouped by increased product yield and reliability.

In accordance with one aspect of the invention, an integrated circuit die includes a substrate having a front surface and a back surface, wherein the substrate front surface has electrical circuits formed thereon, and the back surface has a plurality of metal layers formed thereon. The plurality of metal layers comprises at least one layer having a thickness of greater than about ten micrometers. The outermost metal layer may be mechanically and thermally bonded to a package using a die attach layer comprising a thermally conductive reflowable material.

The metal layers are preferably configured such that delamination, fracturing and metal diffusion into the substrate are avoided, while heat dissipation is increased. In the above-noted illustrative embodiment, the plurality of metal layers includes five metal layers. More specifically, this embodiment includes a first layer comprising titanium deposited on the substrate back surface. Subsequently, a second layer comprising chromium, a third layer comprising gold, a fourth layer comprising copper, and a fifth layer comprising nickel are sequentially formed on the first layer comprising titanium. The layer comprising copper has a thickness of about 150 micrometers. The metal layers may be formed by a wide variety of deposition methods including sputtering, evaporation, chemical vapor deposition and electroplating. Additionally, in accordance with another aspect of the invention, the plurality of metal layers may be formed before or after dicing the substrate wafer into individual integrated circuits.

These and other features and advantages of the present invention will become apparent from the following detailed description which is to be read in conjunction with the accompanying drawings.

DETAILED DESCRIPTION OF THE INVENTION

The term "integrated circuit die" as used herein may comprise any type of device wherein electrical circuits are fabricated in or on a semiconductor substrate. A given integrated circuit die may be of any type including analog, digital or mixed signal. Furthermore, a given die may comprise electrical circuits of any type, configuration and dimension.

Moreover, the term "substrate" comprises any type of crystalline semiconductor material and is not limited to that formed of silicon. Optionally, other materials may be used such as gallium arsenide and indium phosphide. Additionally, a substrate may comprise one or more materials in addition to a semiconductor material. For instance, a substrate as defined herein would encompass Silicon-on-Insulator (SOI) wafers which comprise both crystalline silicon and silicon dioxide.

The term "package" as used herein comprises any type of structural arrangement used to facilitate electrical connection to the integrated circuit die while providing mechanical and environmental protection for the die.

The term "metal layer" includes, in part, any stratum of matter composed substantially of pure metal. The term further includes strata of matter composed of metal elements bonded with non-metallic elements, such as, but not limited to, refractory metal silicides and nitrides. Furthermore, the term "metal layer" comprises strata of matter composed of metal elements of one type bonded with metal elements of another type. For instance, the term would include an alloy comprising titanium and tungsten.

FIGS. 1-4 show the elements of the present invention in various views and at various points in a possible processing sequence. Although the present invention will be described with reference to illustrative embodiments, numerous modifications and variation can be made and the result will still come under the scope of the invention. No limitation with respect to the specific embodiments described herein is intended or should be inferred.

Figure 1:
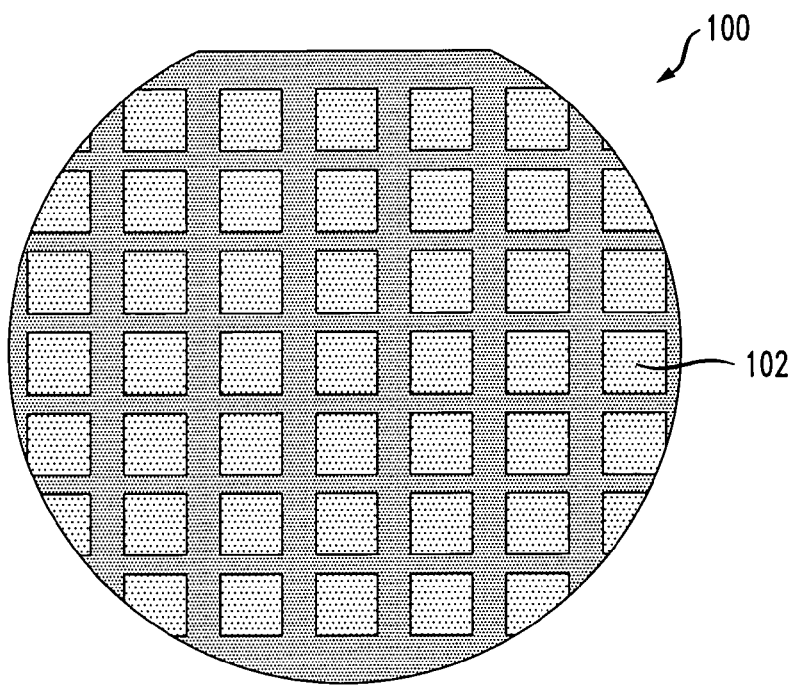
FIG. 1 shows a top down view of a semiconductor wafer comprising a plurality of integrated circuits.

FIG. 1 shows a substrate in the form of a wafer 100 with electrical circuits formed thereon so as to describe a plurality of discrete integrated circuits, represented collectively by integrated circuit die 102. A typical wafer can incorporate between 500 and 1,200 integrated circuits depending on the technology. Substrate thickness is typically on the order of 635 micrometers but may optionally be reduced by backside grinding and polishing to facilitate packaging. Various methods for forming such electrical circuits are commonly practiced and will be known to those skilled in the art. Processing steps that may be used in such methods include, but are not limited to: deposition, growth, etching, lithography, polishing, cleaning, stripping, annealing and ion implanting. These processing steps are described in detail in a number of publications, including S. Wolf and R. N. Tauber, *Silicon Processing for the VLSI Era*, Volume 1 (1986), which is incorporated by reference.

In accordance with one aspect of the present invention, a plurality of metal layers is then formed on the side of the substrate opposite to that where the electrical circuits have been formed, with at least one of the layers comprising a layer having a thickness greater than about ten micrometers. Advantageously, one or more of the metal layers may be formed before or after dicing the wafer 100 into individual integrated circuits. The decision concerning the sequence of backside deposition and wafer dicing can be optimized to best utilize the capabilities of the tooling available in a given fabrication facility. Many fabrication tools associated with Front-End-Of-Line (FEOL) processing, such as chemical vapor deposition tools currently manufactured by Applied Materials (Santa Clara, Calif.), are, of course, primarily configured to process wafers, not individual integrated circuits. Consequently, the use of such tooling for forming one or more metal layers within the plurality of metal layers would drive the decision to process the substrate in wafer form before dicing.

The process of wafer dicing is not substantially altered by implementation of the present invention and, therefore, will be familiar to one skilled in the art. Typically, the wafer dicing process involves a rotating abrasive disk which acts as a blade to divide the wafer. A spindle at high speed, commonly 30,000 to 60,000 rpm, rotates the blade. The blade is typically made of abrasive diamonds, which are embedded in an electroplated nickel matrix binder. During the dicing of the integrated circuits, the blade simultaneously crushes the substrate material and removes the created debris.

There are many alternatives with respect to the configuration of the plurality of metal layers formed on the back surface of the substrate. While improved heat dissipation is one of the goals of the present invention, one skilled in the art will recognize that the configuration of metal layers may need to be further tailored to avoid adverse effects resulting from stress and the interdiffusion of matter. Stress may result from differences in the thermal expansion rate between the deposited materials or intrinsically from the structure of the films. Such stress may cause delamination, blistering or fracturing. Moreover, metal diffusion into the substrate may affect electrical device characteristics. For example, if copper diffuses into the electrical device region of the integrated circuit die, it may cause either a threshold voltage shift or leakage in metal-oxide-semiconductor (MOS) transistors. Copper contamination in the electrically active regions of the die may also cause leakage or charge storage in interlevel dielectric layers.

Figure 2:
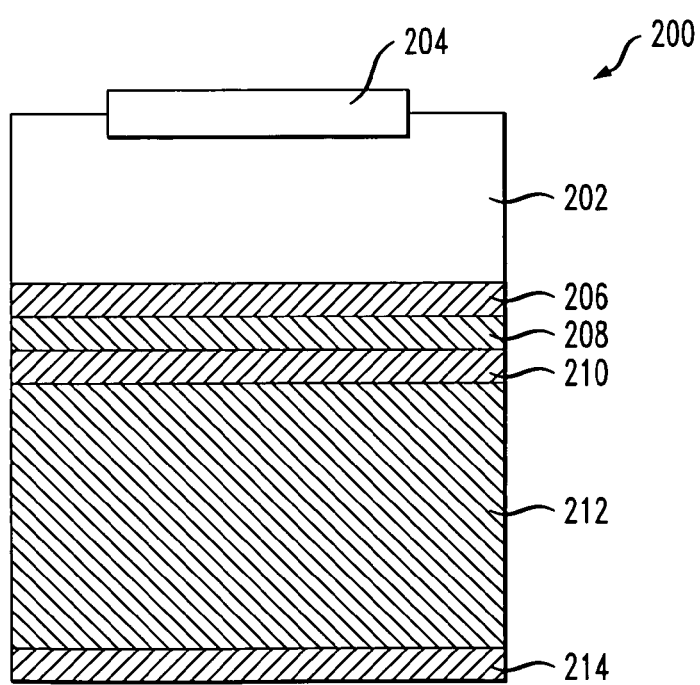
FIG. 2 shows a full sectional view of a integrated circuit die embodying features of the present invention.

One illustrative embodiment that avoids these adverse effects comprises the use of five metal layers on a silicon substrate and is shown in FIG. 2. FIG. 2 shows a die 200 after dicing comprising a discrete substrate 202, with its associated electrical circuitry 204, after formation of the five metal layers 206, 208, 210, 212 and 214. In this illustrative embodiment, the first metal layer 206 comprises sputtered titanium in a thickness from about 150 to about 400 Angstroms. The second layer 208 comprises sputtered chromium in a thickness from about 400 to about 1,500 Angstroms. The third layer 210 comprises sputtered gold in a thickness from about 2,000 to about 4,000 Angstroms. The fourth layer 212 comprises electroplated copper in a thickness from about 100 to about 200 micrometers. Finally, the fifth layer 214 comprises electroless plated nickel in a thickness from about 500 to about 2,500 Angstroms. One should note that the layers shown in FIG. 2 are not necessarily to scale for simplicity and clarity of illustration.

The configuration of metal layers in FIG. 2 has been experimentally shown to be devoid of delamination, blistering or fracturing during the fabrication process and during operation of the integrated circuit. This configuration also effectively restricts metal interdiffusion from the deposited backside films into the substrate. Furthermore, in accordance with one goal of the present invention, this configuration of metal layers advantageously augments heat dissipation away from the substrate. The design was experimentally shown to increase the heat dissipation from the integrated circuit die by more than 25% when compared to an integrated circuit die without the backside metal layers formed thereon.

The configuration of metal layers shown in FIG. 2 is advantageous because of the symbiotic relationship between the various layers. Titanium is commonly known among those skilled in the art to have very good adhesion with silicon and thereby to create an effective "glue layer." Chromium acts as a barrier layer to stop any metal diffusion into the substrate, provides a stress buffer layer between the thick copper and titanium, and also acts to prevent fracturing inside the metal stack due to its high fracture strength. The next layer comprising gold acts as a seed layer to facilitate copper electroplating. The thick copper layer is an excellent heat conductor. Finally, the outermost nickel layer provides protection for the underlying copper layer from mechanical scratching and corrosion. The nickel layer also provides an excellent surface for using standard die-attach materials such as gold alloys, lead-tin solders and epoxies.

Importantly, one skilled in the art will further recognize that there are many other configurations of metal layers that may achieve similar advantageous results with respect to heat dissipation and also fall under the scope of the present invention. For instance, other embodiments may comprise tantalum, palladium, vanadium or molybdenum as the first layer in contact with the substrate back surface. Like titanium, these metals have excellent adhesion with silicon because they form intermediate metal-silicides with silicon at relatively low temperatures.

Alternatively or additionally, layers formed of transition metal-nitrides may be used in addition to, or in place of chromium to act as a diffusion barrier. Such materials include, but are not limited to, tantalum nitride, titanium nitride and molybdenum nitride. These materials are universally recognized as good barrier materials for the diffusion of copper and aluminum. Furthermore, these materials have good adhesion properties and are stable during manufacturing and operation of the device.

Moreover, other materials may replace copper as the relatively thick metal layer with a thickness greater than about ten micrometers. For instance, the thick metal layer could be formed of silver, gold or aluminum. While aluminum and gold have thermal conductivities substantially lower than that of copper and silver, beneficial heat dissipation effects may still be obtained with these materials. The use of materials other than copper may also be beneficial from the viewpoint of avoiding contamination in the electrically active regions of the device and from a processing cost standpoint. For instance, aluminum deposition technologies are commonly available in most semiconductor fabrication sites. The use of aluminum also lessens the risks associated with contamination of the electrically-active devices when compared to copper.

Consequently, another embodiment of the present invention, for example, comprises just three layers of metal. The first layer, to be deposited on the back surface of the substrate, would be formed of titanium. The subsequent second layer would formed of titanium nitride. Finally, the third metal layer would comprise a layer formed of aluminum with a thickness greater than about ten micrometers.

Advantageously, the present invention is not limited to any specific deposition technique or techniques for any given metal layer. Techniques for depositing the metal layers include, but are not limited to: sputtering, evaporation, chemical vapor deposition and electroplating. Background on these techniques and others is provided in, for example, R. F. Bunshah, *Handbook of Deposition Technologies for Films and Coatings, Science and Technology Applications* (2d ed. 1994), which is incorporated by reference.

For example, one or more of the metal layers can be deposited by sputtering. Sputtering is a widely utilized deposition technique for a variety of metallic films including aluminum, titanium and tungsten. In sputtering, ions are generated and directed at a target formed of the material intended to be deposited. The ions knock off target atoms which are transported to the substrate where they condense and form a film.

Alternatively or additionally, one or more films can be deposited by evaporation wherein vapors are produced from a material located in a source which is heated. Heating commonly occurs by direct resistance, radiation, eddy currents, electron beam, laser beam or an arc discharge. The vapors are then condensed on the substrate to form a film. Film growth rates with evaporation are substantially faster than those achieved by sputter deposition. Sputtering and evaporation are within a class of deposition techniques referred to as physical vapor deposition.

Alternatively or additionally, one or more films can be deposited by chemical vapor deposition. Molybdenum and tungsten are commonly deposited with this technique, as are many of the metal silicides. In chemical vapor deposition, a solid material is deposited from vapor-phase reactants by chemical reactions occurring on or near the surface of a wafer. The wafer is normally heated to increase the rate of the chemical reactions.

Finally, one or more films can be deposited by electroplating. This is the most common technique for depositing copper. In electroplating, the substrate is immersed into a container containing a solution of metal ions. Electrons are then passed through the substrate causing the metal ions at the surface of the substrate to be chemically reduced and to form a coating of substantially pure metal on the substrate. Alternatively, one or more films can be deposited by electroless plating. Electroless plating is a variant of electroplating. Electroless plating processes differ from electroplating processes in that no external current source is required. Metal coatings are produced by chemical reduction with electrons supplied by a reducing agent present in the solution.

The electroplating of metal frequently requires a seed layer to be deposited prior to the electroplating process in order to nucleate efficient and uniform layer growth. The seed layer may be formed of many different materials and its choice depends on the composition of the layer to be subsequently deposited by electroplating. In addition, the seed layer can be deposited by many different techniques, including, but not limited to: sputtering, evaporation or chemical vapor deposition. In the illustrative embodiment described in FIG. 2, a seed layer for the electroplated copper layer 212 comprises sputtered gold 210. Other materials such as sputtered copper may also act as an effective seed layer for electroplating copper.

After metal deposition and dicing are both completed, the packaging of the integrated circuits can begin. There are a wide variety of packaging technologies that are compatible with the present invention such as, but not limited to, plastic leadframe-based technologies and hermetic packaging technologies. These technologies and others are described in, e.g., S. M. Sze, *VLSI Technology* (2d ed. 1988), which is incorporated by reference.

Figure 3:
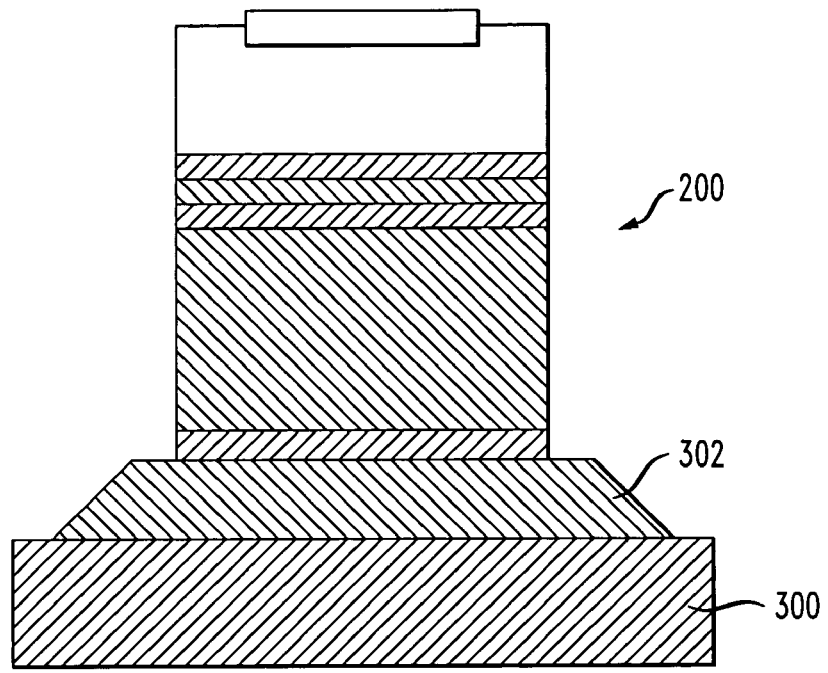
FIG. 3 shows a full sectional view of a integrated circuit die embodying features of the present invention bonded to an attachment baseplate of a package.

Typically, the integrated circuit dice undergo die bonding wherein the integrated circuits are mechanically and thermally attached to the packaging. FIG. 3 shows the substrate with the plurality of metal layers formed thereon, 200, bonded to a package attachment baseplate 300. In the illustrative embodiment, the attachment baseplate is a metal leadframe 300 such as that typically used in plastic leadframe-based packages. However, the integrated circuit die may be bonded to other types of baseplates depending on the type of package. For instance, in some package technologies, the integrated circuit die is bonded to a ceramic or plastic substrate. In the illustrative embodiment, the integrated circuit die is bonded to the attachment substrate using a thermally conductive, reflowable material 302 such as gold alloy, soft lead-tin solder, or epoxy.

The process of die attachment is, advantageously, not altered by implementing this invention and will be familiar to those skilled in the art. Typically, die attachment involves raising the die attach material to a temperature where the die attach material flows for 5 to 20 seconds. The die is often simultaneously moved in a "scrubbing" motion. Temperatures for epoxy-based die attach materials are typically from 125-175 degrees Celsius. Temperatures used for solder die attach materials typically range from 260-345 degrees Celsius. Significantly higher temperatures may be necessary for gold-based die attach materials. This temperature is strongly dependent on the compositional percentage of gold.

Typically the subsequent processing step involves wire bonding, wherein an electrical connection is established between the integrated circuit die and the package. This step is also advantageously unaltered by the implementation of the present invention and will be familiar to one skilled in the art.

Finally, the substrate bonded to the package attachment baseplate is subjected to the molding process. Molding compounds protect the device mechanically and environmentally from the outside environment. Transfer molding is typically used to encapsulate plastic leadframe-based packages. This process involves the liquidization and transfer of pelletized molding compound in a mold press. The liquidization results in a low viscosity material that readily flows into the mold cavity of the package and completely encapsulates the device. Subsequently, the molding compound is typically cured one or more times until the resin system is hardened.

Molding compounds are typically formulated from epoxy resins containing inorganic fillers, catalysts, flame retardants, stress modifiers, adhesion promoters and other additives. Fused silica, the filler most commonly used in plastic leadframe-based packages, imparts the desired coefficient of thermal expansion, elastic modulus, and fracture toughness properties to the mold.

Figure 4:
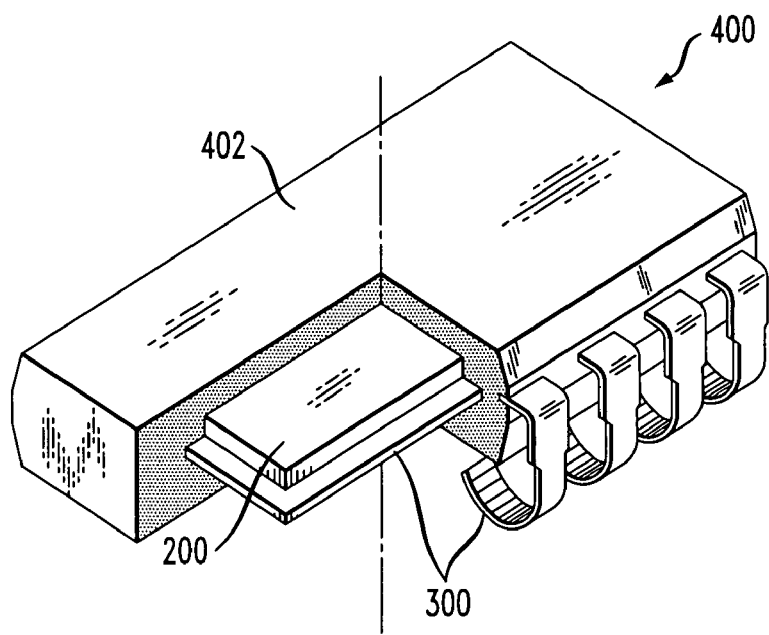
FIG. 4 shows a partial sectional view of an integrated circuit die embodying features of the present invention incorporated in a package.

FIG. 4 shows the integrated circuit die 200 integrated into a plastic leadframe-based package, 400. In this embodiment, a molding compound 402 acts to encapsulate and support the integrated circuit die 200 and the leadframe 300. Again, the particular package assembly shown is not a requirement of this invention, and this and other packages suitable for use with the present invention will be familiar to those skilled in the art.

It should be noted that a plurality of identical die are typically formed in a repeated manner on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It should also be emphasized that the above-described embodiments of the invention are intended to be illustrative only. Other embodiments can use different types and arrangements of elements for implementing the described functionality. These numerous other alternative embodiments within the scope of the following claims will be apparent to one skilled in the art.

What is claimed is:

1. An integrated circuit die comprising:
   a substrate having a front surface and a back surface;
   a plurality of electrical circuits formed on the substrate front surface; and
   a plurality of metal layers formed on the substrate back surface;
   wherein the plurality of metal layers comprises:
   a first layer comprising titanium having a thickness of about 150 to about 400 Angstroms formed on the substrate back surface;
   a second layer comprising chromium having a thickness of about 400 to about 1,500 Angstroms formed on the first layer;
   a third layer comprising gold having a thickness of about 2,000 to about 4,000 Angstroms formed on the second layer;
   a fourth layer comprising copper having a thickness of about 100 to about 200 micrometers formed on the third layer; and
   a fifth layer comprising nickel having a thickness of about 500 to about 2,500 Angstroms formed on the fourth layer wherein the plurality of metal layers is further configured to increase the heat dissipation from the substrate by more than about 25% when compared to a substrate without metal layers formed on the back surface.

2. The integrated circuit die of claim 1 wherein one or more of the plurality of metal layers are formed by sputtering.

3. The integrated circuit die of claim 1 wherein one or more of the plurality of metal layers are formed by electroplating.

4. A method of forming an integrated circuit die comprising:
   forming a substrate having a front surface and a back surface;
   forming electrical circuits on the substrate front surface; and
   forming a plurality of metal layers on the substrate back surface;
   wherein the plurality of metal layers comprises;
   a first layer comprising titanium having a thickness of about 150 to about 400 Angstroms formed on the substrate back surface;
   a second layer comprising chromium having a thickness of about 400 to about 1,500 Angstroms formed on the first layer;
   a third layer comprising gold having a thickness of about 2,000 to about 4,000 Angstroms formed on the second layer;
   a fourth layer comprising copper having a thickness of about 100 to about 200 micrometers formed on the third layer; and
   a fifth layer comprising nickel having a thickness of about 500 to about 2,500 Angstroms formed on the fourth layer wherein the plurality of metal layers is further configured to increase the heat dissipation from the substrate by more than about 25% when compared to a substrate without metal layers formed on the back surface.

5. The method of forming an integrated circuit die of claim 4 further comprising thinning the substrate before forming the plurality of metal layers on the substrate back surface.

6. The method of forming an integrated circuit die of claim 4 wherein the forming of the plurality of metal layers on the substrate back surface is performed before dicing the substrate into individual integrated circuit dice.

7. The method of forming an integrated circuit die of claim 4 wherein the depositing of the plurality of metal layers on the substrate back surface is performed after dicing the substrate into individual integrated circuit dice.

* * * * *